(12) United States Patent
Brendel et al.

(10) Patent No.: US 8,774,475 B2
(45) Date of Patent: Jul. 8, 2014

(54) TWO-POINT DIXON TECHNIQUE WITH FLEXIBLE CHOICE OF ECHO TIMES

(75) Inventors: Bernhard Brendel, Norderstedt (DE); Holger Eggers, Ellerhoop (DE); Adri J. Duijndam, Nijmegen (NL)

(73) Assignee: Koninklijke Philips N.V., Eindhoven (NL)

( * ) Notice: Subject to any disclaimer, the term of this patent is extended or adjusted under 35 U.S.C. 154(b) by 376 days.

(21) Appl. No.: 13/257,315

(22) PCT Filed: Feb. 19, 2010

(86) PCT No.: PCT/IB2010/050745
§ 371 (c)(1),
(2), (4) Date: Sep. 19, 2011

(87) PCT Pub. No.: WO2010/113048
PCT Pub. Date: Oct. 7, 2010

(65) Prior Publication Data
US 2012/0008847 A1 Jan. 12, 2012

Related U.S. Application Data

(60) Provisional application No. 61/221,110, filed on Jun. 29, 2009, provisional application No. 61/164,608, filed on Mar. 30, 2009.

(51) Int. Cl.
*G06K 9/00* (2006.01)

(52) U.S. Cl.
USPC .......................................... 382/128; 382/131

(58) Field of Classification Search
CPC ............... G01R 33/4828; G01R 33/56563; G06T 2207/10088; G06T 2207/10092; G06T 2207/10096
USPC ................................................ 382/128, 132
See application file for complete search history.

(56) References Cited

U.S. PATENT DOCUMENTS

| | | | | |
|---|---|---|---|---|
| 5,627,469 A * | 5/1997 | Hong et al. | | 324/309 |
| 5,909,119 A * | 6/1999 | Zhang et al. | | 324/309 |
| 6,263,228 B1 * | 7/2001 | Zhang et al. | | 600/409 |
| 6,515,476 B1 * | 2/2003 | Oshio et al. | | 324/309 |
| 6,597,172 B2 * | 7/2003 | Miyoshi | | 324/307 |
| 7,196,518 B2 | 3/2007 | Yatsui et al. | | |
| 7,227,359 B2 * | 6/2007 | Ma | | 324/309 |
| 8,000,769 B2 * | 8/2011 | Yu et al. | | 600/410 |
| 8,030,923 B2 * | 10/2011 | Yu et al. | | 324/309 |
| 2007/0098298 A1 * | 5/2007 | Xiang | | 382/276 |
| 2008/0218169 A1 | 9/2008 | Bookwalter et al. | | |

OTHER PUBLICATIONS

Ma, J., et al.; Fat-Suppressed Three-Dimensional Dual Echo Dixon Technique for Contrast Agent Enhanced MRI; 2006; J. of Magnetic Resonance Imaging; 23:36-41.
Ma, J., et al.; Dixon Techniques for Water and Fat Imaging; 2008; J. of Magnetic Resonance Imaging; 28:543-558.
Szumowski, J., et al.; Double-Echo Three-Point-Dixon Method for Fat Suppression MRI; 1995; MRM; 34:120-124.
Xiang, Q.; Two-Point Water-Fat Imaging with Partially-Opposed-Phase (POP) Acquisition: An Asymmetric Dixon Method; 2006; MRM; 56:572-584.

* cited by examiner

*Primary Examiner* — Tom Y Lu

(57) ABSTRACT

When distinguishing between fat and water in acquired MR data, a modified Dixon technique includes acquiring first and second signals Ii and I2, calculating the first and second components B and S of the signals $I_x$ and I2, where one of the first and second components corresponds to fat and the other corresponds to water, deriving two differential phase error candidates from them, and selecting a phase error candidate based on the assumption of smoothness of the disturbing field inhomogeneity. The exact determination of the absolute values of the water and fat components is then made by solving three signal equations for two variables that respectively correspond to water and fat, and is performed using for example a least square minimization with a Newton method.

15 Claims, 9 Drawing Sheets

TWO-POINT DIXON TECHNIQUE WITH FLEXIBLE CHOICE OF ECHO TIMES

CROSS REFERENCE TO RELATED APPLICATIONS

This application claims the benefit of U.S. provisional application Ser. No. 61/164,608 filed Mar. 30, 2009 and U.S. provisional application Ser. No. 61/221,110 filed Jun. 29, 2009, both of which are incorporated herein by reference.

BACKGROUND

The present innovation finds application in magnetic resonance imaging (MRI) systems, particularly with regard to fat suppressed MRI and fat quantification with MRI. However, it will be appreciated that the described techniques may also find application in other imaging systems, other magnetic resonance scenarios, other image data collection techniques, and the like.

When measuring an "echo," a B1 field is generated parallel to a longitudinal axis through an examination region of an MR scanner, which causes cellular nuclei in the examination region to momentarily align with the B1 field. Different materials (e.g., fat and water) nuclei resonate or "spin" back to their original positions at different rotational velocities. An echo is caused and detected by the MR scanner, such as by reversing the B1 field. The nuclei of different materials are at different positions in their respective rotations at the time the echo is generated (e.g., "echo time") due to their different rotational velocities, and can thus be differentiated during image reconstruction. Other techniques employ for instance gradient-echo instead of the described spin-echo acquisitions.

The suppression of lipid signal is a common requirement in numerous applications of MRI. Moreover, a simultaneous quantification of water and fat signal receives growing interest lately, for instance in the context of obesity and metabolic disorder diseases. One approach to meet both demands is Dixon imaging, which is based on the different chemical shift of water and lipid protons and resulting phase differences between the signals from them at different echo times, which permit a retrospective separation in image reconstruction.

In particular in rapid imaging, Dixon imaging is typically performed with two different echo times only to keep scan times as short as possible. Available two-point Dixon methods impose constraints on the water-fat angle at the different echo times used for data acquisition. These lead to reduced flexibility in sequence design and thus often to increased scan times.

For instance, one or both echo times have a fixed phase, which leads to increased scan times. That is, conventional Dixon imaging techniques employ at most only one variable or arbitrary phase echo time, while require at least one fixed phase echo time.

The present application provides new and improved systems and methods for distinguishing between materials (e.g., fat and water) having different resonant characteristics using an enhanced Dixon technique for MRI, which overcome the above-referenced problems and others.

SUMMARY

In accordance with one aspect, a method of differentiating between water and fat tissue in MRI data comprises measuring a first signal ($I_1$) and a second signal ($I_2$) at different arbitrary echo times during a magnetic resonance (MR) scan of a subject, and calculating first and second components from the first and second signals. The method further includes deriving two differential phase error candidates from the first and second components, and selecting, for each pixel, one of the derived differential phase error candidates based on an assumption of smoothness of disturbing field inhomogeneity. Additionally, the method includes reconstructing a water image and a fat image using the selected differential phase error candidate.

According to another aspect, a system that uses a modified Dixon technique to differentiate between water and fat tissue in MRI data includes a processor programmed to measure a first signal ($I_1$) and a second signal ($I_2$) at different arbitrary echo times during a magnetic resonance (MR) scan of a subject, and to calculate first and second components from the first and second signals. The processor is further programmed to derive two differential phase error candidates from the first and second components, and to select, for each pixel, one differential phase error candidate, based on an assumption of smoothness of disturbing field inhomogeneity. The system further includes a reconstruction processor that reconstructs a water image and a fat image using the selected differential phase error candidate, and a memory that stores the reconstructed images.

One advantage is that scan time is reduced.

Another advantage is that image quality is improved.

A further advantage is that the flexibility of protocol parameter selection is increased.

Still further advantages of the subject innovation will be appreciated by those of ordinary skill in the art upon reading and understand the following detailed description.

BRIEF DESCRIPTION OF THE DRAWINGS

The drawings are only for purposes of illustrating various aspects and are not to be construed as limiting.

DETAILED DESCRIPTION

Figure 1:
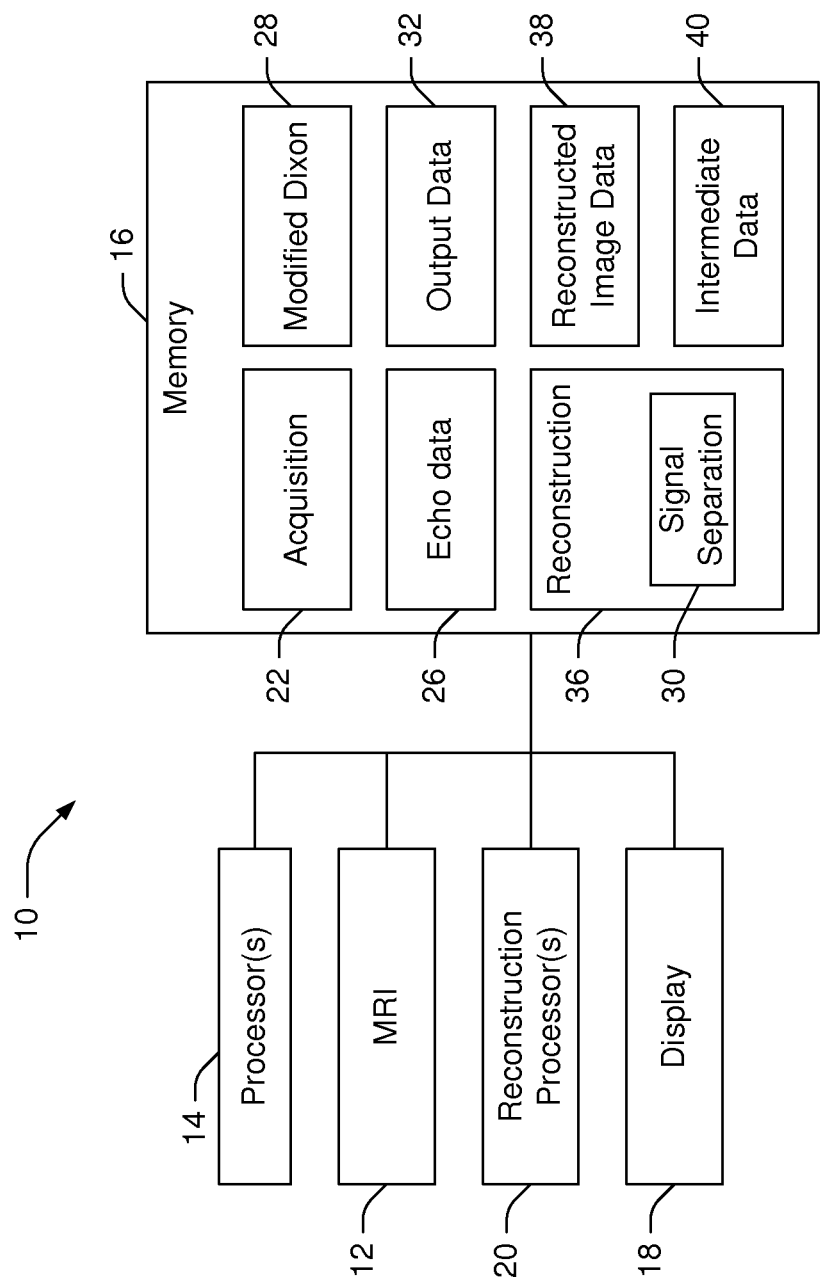
FIG. 1 illustrates a system that facilitates relaxing constraints on echo times used when executing a two-point Dixon technique during an MR scan to improve scan efficiency and increase spatiotemporal resolution and coverage area, in accordance with one or more aspects described herein.

FIG. 1 illustrates a system 10 that facilitates relaxing constraints on echo times used when executing a two-point Dixon technique during an MR scan to improve scan efficiency and increase spatiotemporal resolution and coverage area, in accordance with one or more aspects described herein. The system includes an MRI device 12 that is coupled to a processor 14 that executes, and a memory 16 that stores, one or more sets of computer-executable instructions or algorithms for performing an MR acquisition scan as described herein. The MRI device, processor, and memory are additionally coupled to a display 18 and one or more reconstruction processors 20 that reconstruct acquired and/or processed MR scan data into an MR image for output on the display 18.

MR acquisition software is stored to the memory 16 and executed by the processor(s) 14 to acquire MR data 26 during a scan of a subject positioned in an examination region of the MRI device 12 during the MR scan. Modified Dixon echo sampling software 28 is stored to the memory for execution by the processor, and facilitates acquiring two-point echo data 26 at flexible arbitrary echo times, without requiring that either echo time have a fixed phase, in accordance with various aspects described herein.

Once the MR data 26 are acquired upon execution of the MR acquisition software 22 with the modified Dixon software 28, the signal separation 30 is performed. In one example, the MR acquisition is an echo acquisition (e.g., spin-echo, gradient-echo, etc.). The signal separation is achieved by solving a plurality of mathematical equations that use the data 26 as input and provide as output the intensity of the signal from each species to be separated. This signal intensity output 32 is stored to the memory 16 and used during execution of reconstruction algorithms 36 by the reconstruction processor(s) 20 to generate a reconstructed MR image with differentiated tissue types. The separation is a form of reconstruction, wherein the signal for each pixel is divided (or separated) into components originating from the different species, such as water and fat.

The following description is provided to further explain the function of the separation algorithm(s) 36 using the modified Dixon technique, with regard to the specific example of fat (e.g., lipid) and water (e.g., in non-fatty tissue) in a subject subjected to an MR scan. Using the modified Dixon technique, two signals $I_1$ and $I_2$, measured at two different echo times, are mathematically described as follows:

$$I_1 = (W + F e^{i\Theta_1}) e^{i\phi_1} \quad (1)$$

$$I_2 = (W + F e^{i\Theta_2}) e^{i\phi_2} \quad (2)$$

where W and F are the contribution of water and fat, respectively, to the overall signal (W and F are thus positive real numbers), $\Theta_1$ and $\Theta_2$ are the known water-fat angles at the two echo times, and $\phi_1$ and $\phi_2$ represent phase errors (e.g., for the respective signals) due to system imperfections, such as main field inhomogeneities and the like. Since the values of the phase errors are unknown, a direct determination of W and F from Equations (1) and (2) is not possible. Thus, at this point, the processor estimates a "big" component B and a "small" component S of the respective signals, from equations (1) and (2). The signal components B and S may be stored to the memory 16 as intermediate data 40. One of the components B and S represents W and the other F, but the mapping is unknown until further processing. Therefore, the phase errors are determined to resolve this mapping problem.

In existing approaches to two-point Dixon water-fat separation, the estimation of the phase errors is based on the assumption that they are spatially smooth functions, i.e. they change only slowly over the field of view. The extent to which this assumption is true depends on the magnitude of the phase errors. Since $\phi_2$ can be split up into the phase error $\phi_1$ and a smaller differential phase error $\Delta\phi$, which fulfills the smoothness assumption much better than $\phi_2$, the estimation is simplified by choosing $\Theta_1 = 0$, which causes Equations (1) and (2) to be modified as follows:

$$I_1 = (W + F) e^{i\phi_1} \quad (3)$$

$$I_2 = (W + F e^{i\Theta_2}) e^{i(\phi_1 + \Delta\phi)} \quad (4)$$

In this case, the phase of $I_1$ equals the phase error $\phi_1$, which can be corrected as follows:

$$J_1 = (W + F) \quad (5)$$

$$J_2 = (W + F e^{i\Theta_2}) e^{i\Delta\phi} \quad (6)$$

At this point, the differential phase error $\Delta\phi$ (e.g., the difference between $\phi_1$ and $\phi_2$) remains to be found. Using Equation (6), two candidates for $\Delta\phi$ are computed: one candidate is calculated assuming that the "big" component B is water and the "small" component S is fat, and the other candidate is calculated assuming S is water and B is fat, such that:

$$e^{i\Delta\varphi_1} = \frac{J_2}{B + S e^{i\Theta_2}} \quad (7)$$

$$e^{i\Delta\varphi_2} = \frac{J_2}{S + B e^{i\Theta_2}} \quad (8)$$

The true mapping of B and S to W and F is spatially varying, i.e. it can be different from pixel to pixel. Thus, $\Delta\phi$ is chosen from the two candidates for each pixel separately, such that the overall solution is as smooth as possible. This approach, which presupposes that $\Theta_2 \mod \pi \neq 0$, is known (see, e.g., Xiang Q S. Two-point water-fat imaging with partially-opposed-phase (POP) acquisition: an asymmetric Dixon method. Magn Reson Med 2006; 56:572-584). Once $\Delta\phi$ is estimated, it can be eliminated from Equation (6), and W and F can be calculated from Equations (5) and (6).

In accordance with one or more aspects described herein, the foregoing approach with regard to Equations (1)-(6) is generalized so that $\Theta_1 \neq 0$. For instance, B and S are calculated from Equations (1) and (2) as described above, with the only constraint being $\Theta_1 \neq \pm \Theta_2$. Therefore, the issue becomes estimating the phase errors, and calculating W and F. Additionally, it will be further noted that an estimation of $\phi_1$ is not necessary to calculate W and F. For example, if $I_1$ is multiplied with the conjugate of $I_2$, the resulting equation depends on only W, F, $\Theta 1$, $\Theta 2$, and $\Delta\phi$, such that:

$$I_1^* I_2 = (W + Fe^{-i\Theta_1})(W + Fe^{i\Theta_2})e^{i\Delta\phi} \quad (9)$$

B and S are calculated again, but this time in a generalized form, as described by Equations 1 and 2 in the referenced paper by Xiang. From equation (9), two differential phase error candidates can be derived, as from Equations (7) and (8), such that:

$$e^{i\Delta\varphi_1} = \frac{I_1^* I_2}{(B + Se^{-i\Theta_1})(B + Se^{i\Theta_2})} \quad (10)$$

$$e^{i\Delta\varphi_2} = \frac{I_1^* I_2}{(S + Be^{-i\Theta_1})(S + Be^{i\Theta_2})} \quad (11)$$

Among these two candidates, the actual differential phase error $\Delta\phi$ is selected, typically based on a smoothness assumption, either as described above or by any other appropriate method. Since $\phi_1$ is unknown, Equations (5) and (6) may not be used to calculate W and F. However, three equations, which do not depend on $\phi_1$ and $\phi_2$, can be derived as follows:

$$I_1^* I_1 = (W + Fe^{i\Theta_1})(W + Fe^{-i\Theta_1}) \quad (12)$$

$$I_2^* I_2 = (W + Fe^{i\Theta_2})(W + Fe^{-i\Theta_2}) \quad (13)$$

$$I_1^* I_2 e^{-i\Delta\phi} = (W + Fe^{i\Theta_2})(W + Fe^{-i\Theta_1}) \quad (14)$$

Figure 2:
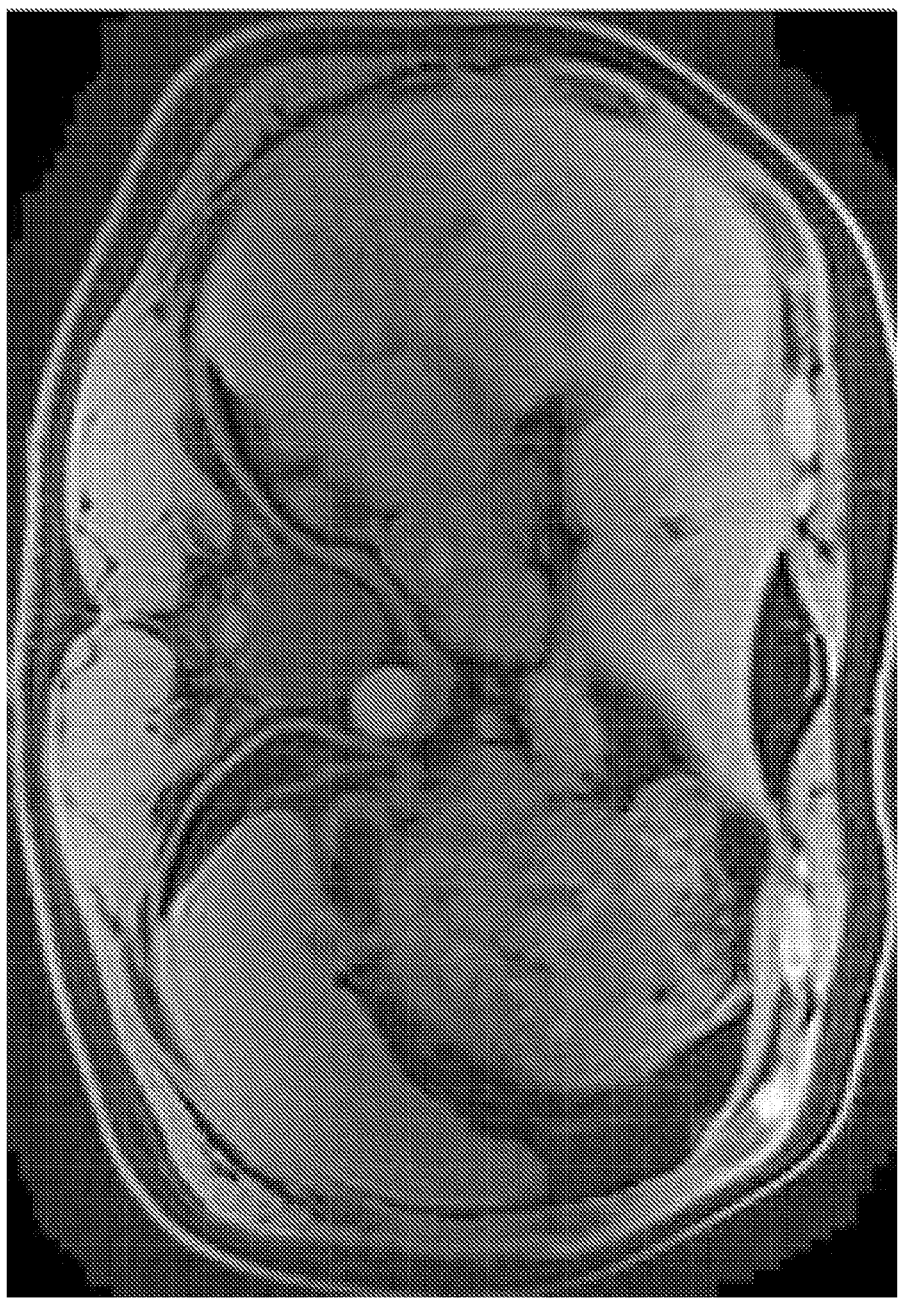
FIG. 2 illustrates an example of a water image (light contrast), calculated using the systems and methods described herein from dual-echo data acquired at 3T with echo times of 1.14 ms and 2.13 ms, corresponding to water-fat angles (Θ) of 179° and 333°.
Figure 3:
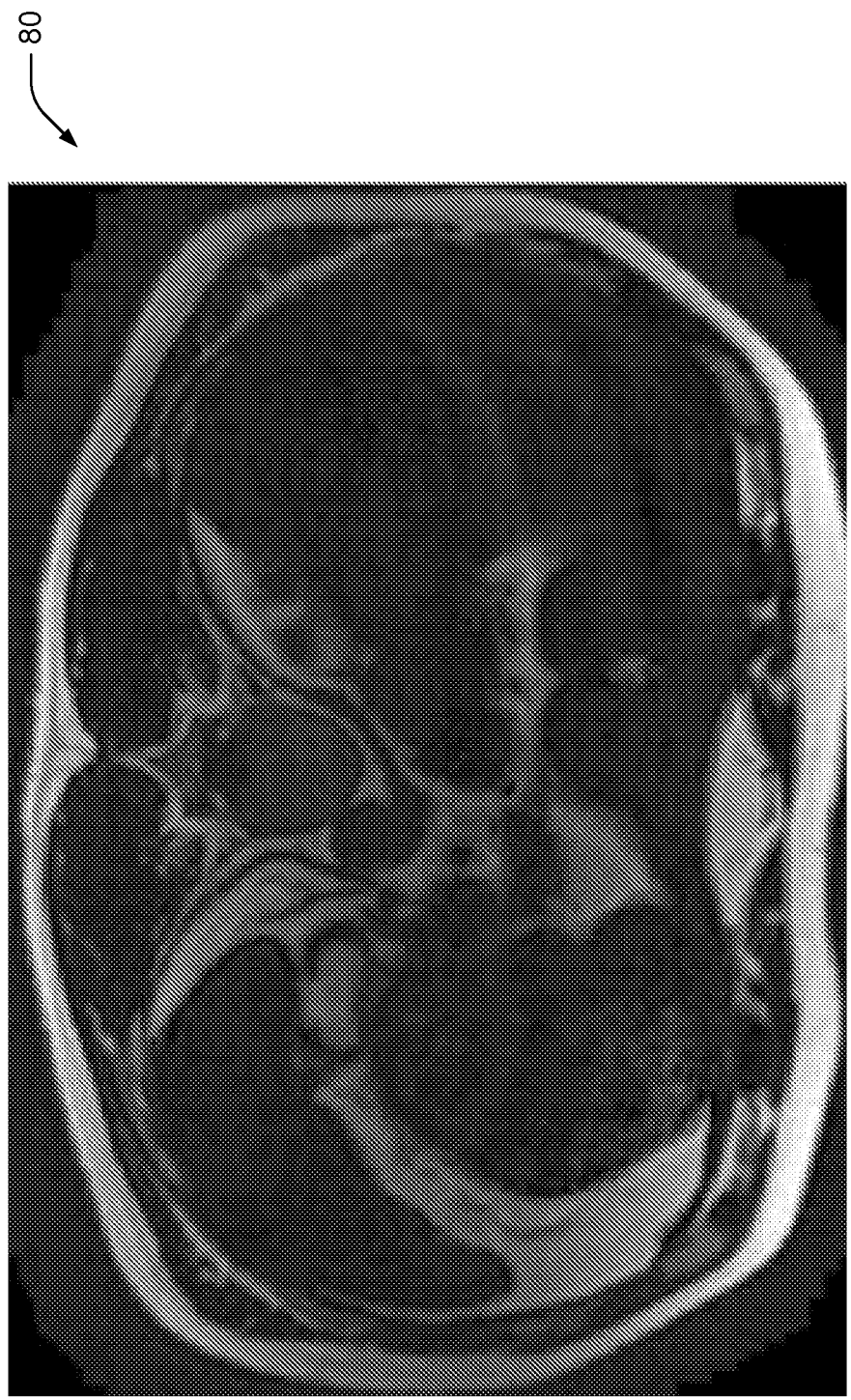
FIG. 3 illustrates an example of a fat image (light contrast), calculated using the systems and methods described herein from dual-echo data acquired at 3T with echo times of 1.14 ms and 2.13 ms, corresponding to a water-fat angles (Θ) of 179° and 333°.

Equation (12) represents the squared magnitude of the first echo signal $I_1$, and Equation (13) represents the squared magnitude of the first echo signal $I_2$. Equation (14) is provided to permit solving for W and F. In one example, W and F are solved by using a least square technique (applying e.g., a Newton method). From Equations (12) and (13) alone, only B and S can be calculated, but once $\Delta\phi$ is estimated as described, W and F can be calculated from Equations (12)-(14) unambiguously, as can be seen in the images for a clinical example, as shown in FIGS. 2 and 3. Alternatively, the signal equation (Equations (3)-(4)) can be solved for all unknowns.

According to one embodiment, the processor 14 weights the signal $I_2$ before solving the three equations (12-14) to compensate for signal decay between the two echo times, using prior knowledge on expected relaxation time constants.

According to another embodiment, the processor 14 applies the herein-described (or any other) two-point Dixon technique to subsets of data acquired using a three-point Dixon technique, to exploit redundancy, ensure consistency, and improve robustness and accuracy of the three-point Dixon technique.

It will be understood that the processor 14 executes, and the memory 16 stores, computer executable instructions for carrying out the various functions and/or methods described herein. The memory 16 may be a computer-readable medium on which a control program is stored, such as a disk, hard drive, or the like. Common forms of computer-readable media include, for example, floppy disks, flexible disks, hard disks, magnetic tape, or any other magnetic storage medium, CD-ROM, DVD, or any other optical medium, RAM, ROM, PROM, EPROM, FLASH-EPROM, variants thereof, other memory chip or cartridge, or any other tangible medium from which the processor 14 can read and execute. In this context, the system 10 may be implemented on or as one or more general purpose computers, special purpose computer(s), a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA, Graphical card CPU (GPU), or PAL, or the like.

FIG. 2 illustrates an example of a water image 70 (light contrast), calculated using the systems and methods described herein from dual-echo data acquired at 3T with echo times of 1.14 ms and 2.13 ms, corresponding to a water-fat angles ($\Theta$) of 179° and 333°.

FIG. 3 illustrates an example of a fat image 80 (light contrast), calculated using the systems and methods described herein from dual-echo data acquired at 3T with echo times of 1.14 ms and 2.13 ms, corresponding to a water-fat angles ($\Theta$) of 179° and 333°.

Figure 4:
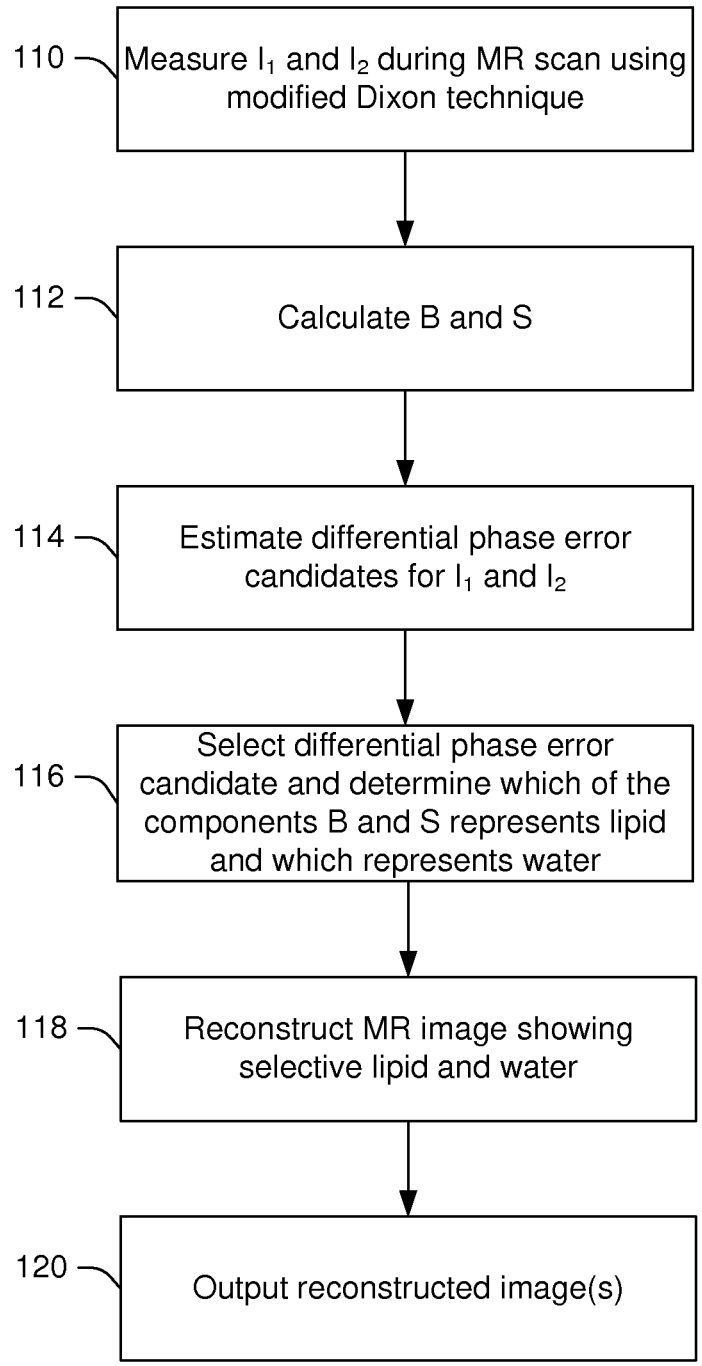
FIG. 4 illustrates a method for differentiating between fat and water molecules in a subject using arbitrary dual-echo data acquired during an MR scan, in accordance with one or more aspects described herein.

FIG. 4 illustrates a method for differentiating between fat and water molecules in a subject using an arbitrary dual-echo data acquired during an MR scan, in accordance with one or more aspects described herein. At 110, two signals $I_1$ and $I_2$ are measured during an MR scan using a modified Dixon technique. Big and small components B and S of the signals $I_1$ and $I_2$ are calculated, at 112. At 114, two differential phase error candidates are derived from them. At 116, one differential phase error candidate is selected, and a determination is made regarding which of the components B and S corresponds to water (W) and which of the components corresponds to fat or lipid (F). At 118, MR images are reconstructed to show selective water and fatty contents of the signal at 120.

Figure 5:
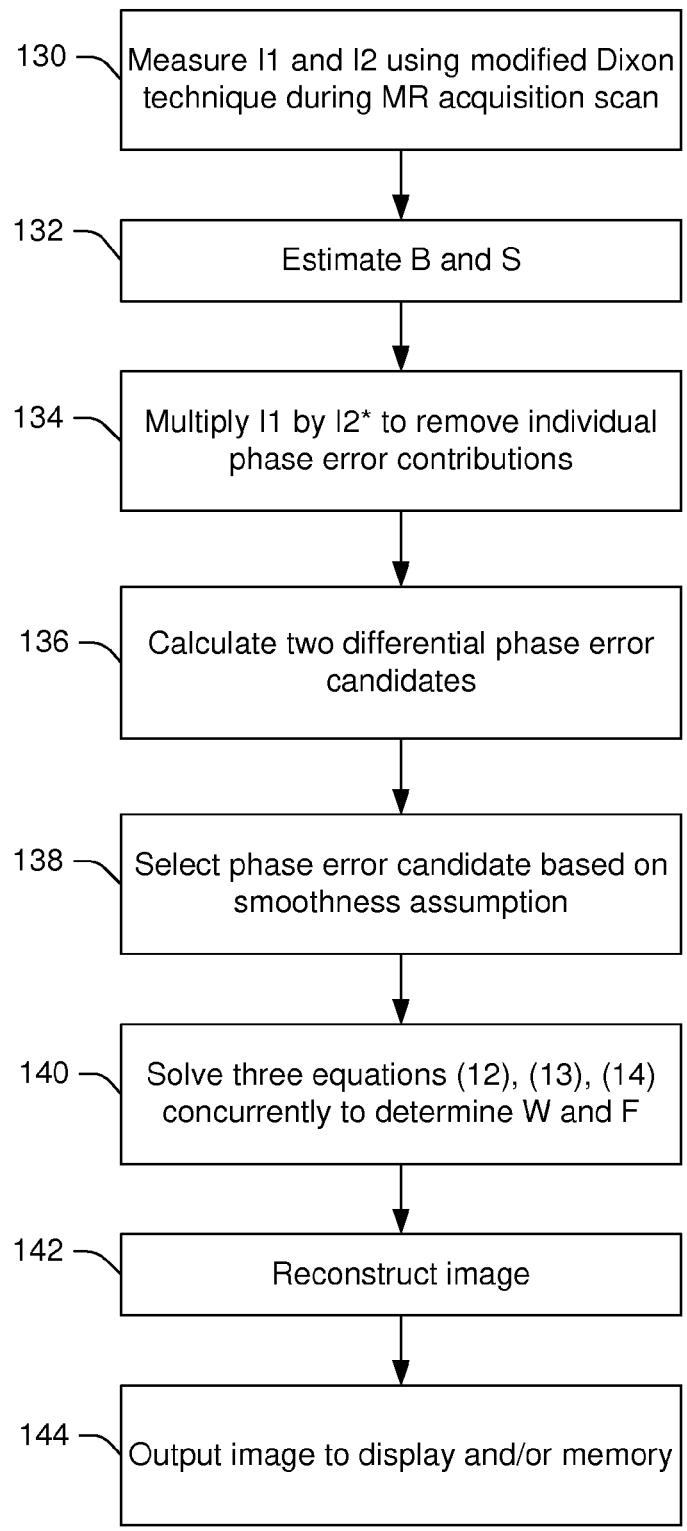
FIG. 5 illustrates a method for differentiating between fat and water molecules in a subject using arbitrary dual-echo data acquired during an MR scan, wherein an estimated differential phase error Δϕ is employed to determine which of a big component B and a small component S of measured signals corresponds to water, and which corresponds to fat, in accordance with one or more aspects described herein.

FIG. 5 illustrates a method for differentiating between fat and water molecules in a subject using arbitrary dual-echo data acquired during an MR scan, wherein an estimated differential phase error $\Delta\phi$ is employed to determine which of a big component B and a small component S of measured signals corresponds to water, and which corresponds to fat, in accordance with one or more aspects described herein. At 130, a modified Dixon technique is used to measure two signals, $I_1$ and $I_2$, at two different echo times during an MR data acquisition. At 132 a "big" component B and a "small" component S of the respective signals are estimated (e.g., from equations (1) and (2)), with the only constraint that $\Theta_1 \neq \pm \Theta_2$. At 134, the signal $I_1$ is multiplied with the conjugate of $I_2$, the resulting equation depends on only W, F, $\Theta 1$, $\Theta 2$, and $\Delta\phi$, as set forth in Equation (9).

At 136, two differential phase error candidates are derived, as set forth by Equations (10) and (11). Among the two candidates, the actual differential phase error $\Delta\phi$ is selected as described above based on the smoothness assumption, at 138. At 140, three equations, which do not depend on $\phi_1$ and $\phi_2$, are derived as follows:

$$I_1^* I_1 = (W + Fe^{i\Theta_1})(W + Fe^{-i\Theta_1}) \quad (12)$$

$$I_2^* I_2 = (W + Fe^{i\Theta_2})(W + Fe^{-i\Theta_2}) \quad (13)$$

$$I_1^* I_2 e^{-i\Delta\phi} = (W + Fe^{i\Theta_2})(W + Fe^{-i\Theta_1}) \quad (14)$$

At 142, the three equations are concurrently solved to determine W and F. The MR scan data is then reconstructed into an image at 144. The image is output to a user (e.g., on the display 18 of FIG. 1) or stored to memory (e.g., the memory 16 of FIG. 1) at 146.

In one embodiment, the methods described herein further include weighting the signal $I_2$ before solving the three equations (12-14) to compensate for signal decay between the two echo times, using prior knowledge on expected relaxation time constants.

In another embodiment, the methods described herein include applying a two-point Dixon technique (e.g., any suitable two-point Dixon technique) to subsets of data collected during three-point Dixon acquisitions, to exploit redundancy, ensure consistency, and improved robustness and accuracy of three-point Dixon techniques.

Figure 6:
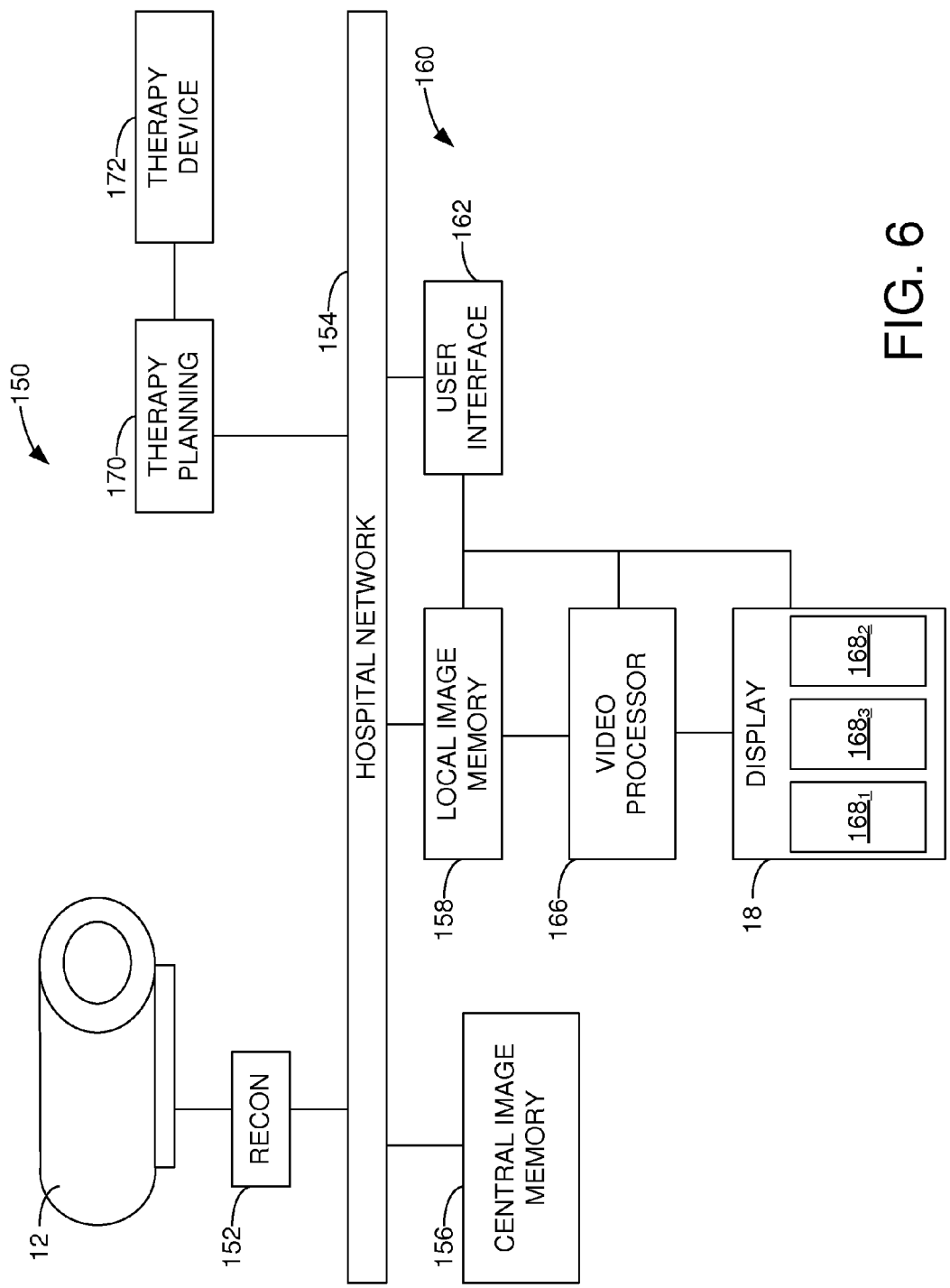
FIG. 6 illustrates an exemplary hospital system including the MRI device, which generates imaging data that is reconstructed by a reconstruction processor to generate 3D image representations.

With reference to FIG. 6, an exemplary hospital system 150 may include an imaging device, such as the MRI device 12, or the like, which generates imaging data that is reconstructed by a reconstruction processor 152 to generate 3D image representations. The image representations are communicated over a network 154 to a central memory 156 or a local memory 158.

At a station 160 connected with the network, an operator uses user interface 162 to move a selected 3D patient MR image to or between the central memory 156 and the local memory 158. A video processor 166 displays the selected MR image in a first viewport $118_1$, of the display 18. A second MR image may be displayed in a second viewport $118_2$. For instance, the water image 70 of FIG. 2 may be displayed in the first viewport, and the fat image 80 of FIG. 3 may be displayed in the second viewport. A third view port $118_3$ can display an overlay of the images in the first and second viewports. Optionally, a user can manipulate the overlay image in the third viewport across a range of relative weights of the fat and water image data. In one embodiment, the user interface includes a knob or slider bar (not shown) that the user can use to adjust the overlay image from purely fat image data to purely water image data, and anywhere in between.

The fat image, water image, and/or overlay image data can be used in other applications. For instance, a therapy planning station 170 can use the image data to plan a therapy session. Once planned to the satisfaction of the operator, the planned therapy can, where appropriate to an automated procedure, be transferred to a therapy device 172 that implements the planned session. Other stations may use the fat and/or water image data in various other planning processes.

Figure 7:
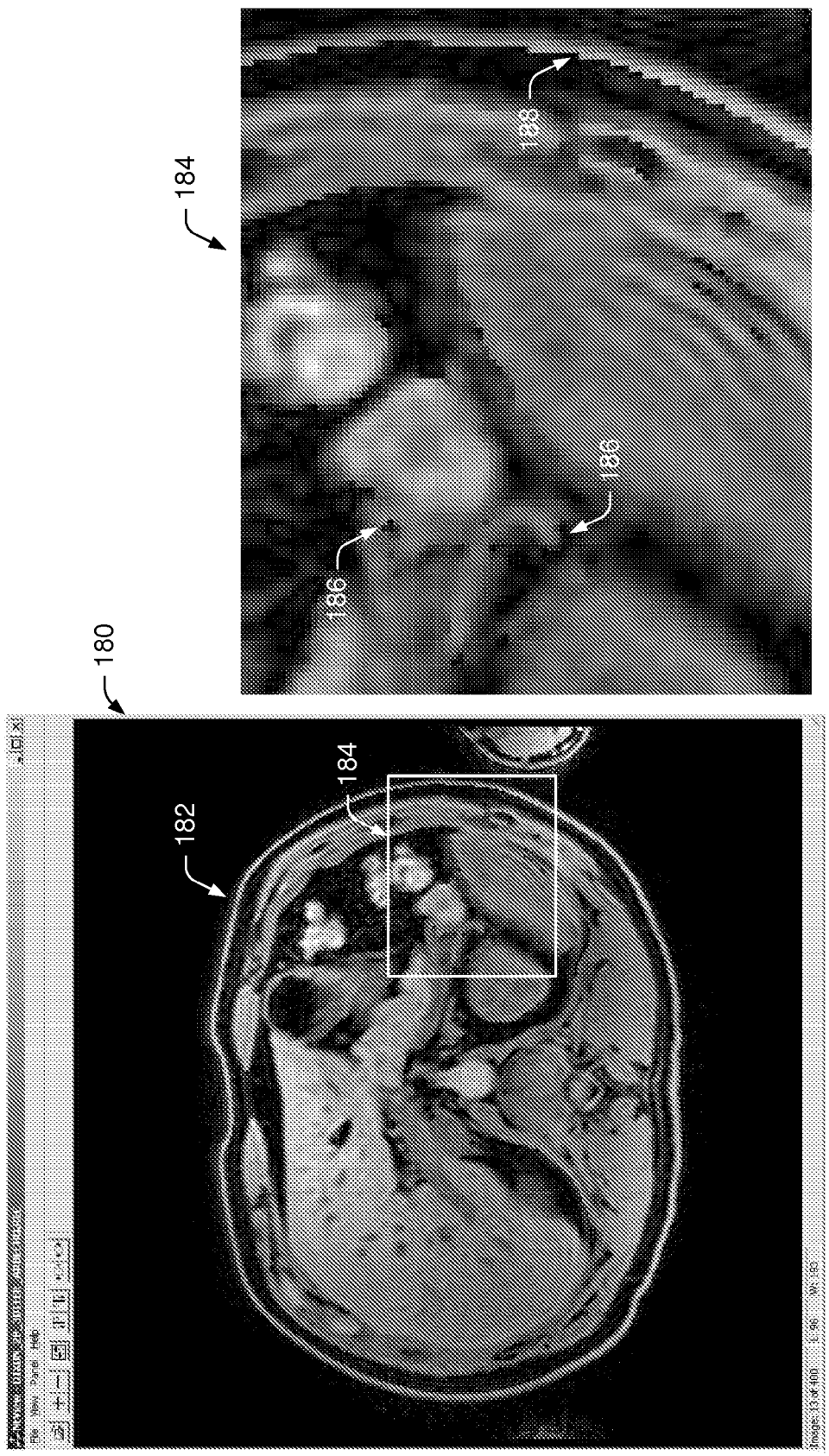
FIG. 7 is an example of an image of a cross-sectional view through a patient generated using the equations (12)-(14), in which a region of the image is enlarged to show artifacts.
Figure 8:
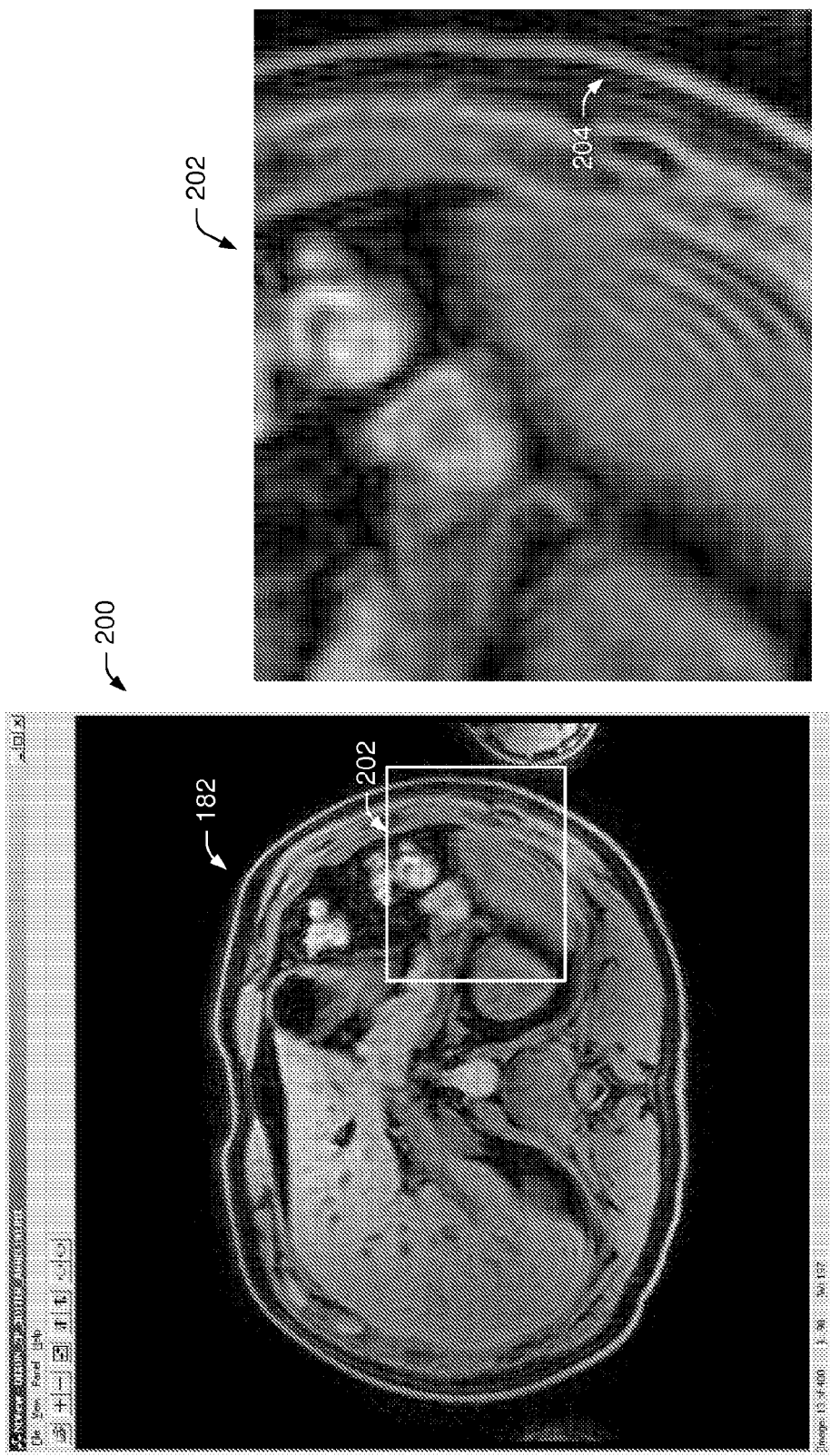
FIG. 8 is an example of an image of the cross-section of the patient, generated using equations (15)-(17) to reduce artifacts and smooth edge lines in the image.

FIGS. 7-8 relate to an embodiment in which the water and fat terms that are computed from the input data using the computed differential phase map are taken to be complex values, in order to reduce artifacts that may arise when employing equations (12)-(14). A linear system of equations (15), (16) results, which can be solved easily and reduces or eliminates the artifacts that may result from equations (12)-(14). According to one embodiment, the systems and methods are executed as described herein with regard to FIGS. 1-6, except that equations (15)-(16) are substituted for equations (12)-(14) (e.g., as described with regard to FIGS. 1 and 5), and solved accordingly.

In this approach, W and F are considered as complex. They are substituted by $W'=We^{i\Phi_1}$ and $F'=Fe^{i\Phi_2}$ in the signal equations (1) and (2) to eliminate $e^{i\Phi_1}$ and $e^{i\Phi_2}$, resulting in the system of two linear, complex, equations:

$$I_1 = W' + F'e^{i\theta_1} \qquad (15)$$

$$I_2 = (W' + F'e^{i\theta_2})e^{i\Delta\phi}. \qquad (16)$$

where W' and F' are the complex valued water and fat terms, and $\theta_1$ and $\theta_2$ are the known water-fat angles at the two echo times. $\phi$ represents phase errors due to system imperfections such as main field inhomogeneity and the like, and therefore $\Delta\phi$ is a similar phase term, but representing the difference phase between the two echoes. Given the data and the differential phase in phasor form $e^{i\Delta\phi}$, the complex water and fat terms can be easily computed. For the final images the absolute values of the water and fat terms are taken Once $e^{i\Delta\phi}$ is estimated as described, this system of equations is solved analytically (e.g., by the processor 14 of FIG. 1) through:

$$\begin{pmatrix} W' \\ F' \end{pmatrix} = \frac{1}{e^{i\theta_2} - e^{i\theta_1}} \begin{bmatrix} e^{i\theta_2} & -e^{i\theta_1} \\ -1 & 1 \end{bmatrix} \begin{pmatrix} I_1 \\ I_2 e^{-i\Delta\varphi} \end{pmatrix}, \qquad (17)$$

and yields directly the magnitude of the water and fat signal, since |W|=|W'| and |F|=|F'|.

In one embodiment, the signal $I_2$ is weighted (e.g., by the processor 14) before solving the three equations to compensate for signal decay between the two echo times, using prior knowledge on expected relaxation time constants Accordingly, FIG. 7 is an example of an image 180 of a cross-sectional view 182 through a patient generated using the equations (12)-(14), in which a region 184 of the image is enlarged to show artifacts 186. Also shown are jagged edge lines 188. Such an image may be generated using the systems and methods described herein, with equations (12)-(14). However, in order to reduce artifacts and smooth edge lines, equation (17) may be employed in place of equations (12)-(14), as shown with regard to the image of FIG. 8.

FIG. 8 is an example of an image 200 of the cross-section 182 of the patient, generated using equation (17) to reduce artifacts and smooth edge lines in the image. A region 202 of the image is enlarged to show the absence of the artifacts 186 visible in FIG. 7. Additionally, the edge lines 204 are significantly smoother than the edge lines 188 of the image of FIG. 7.

Figure 9:
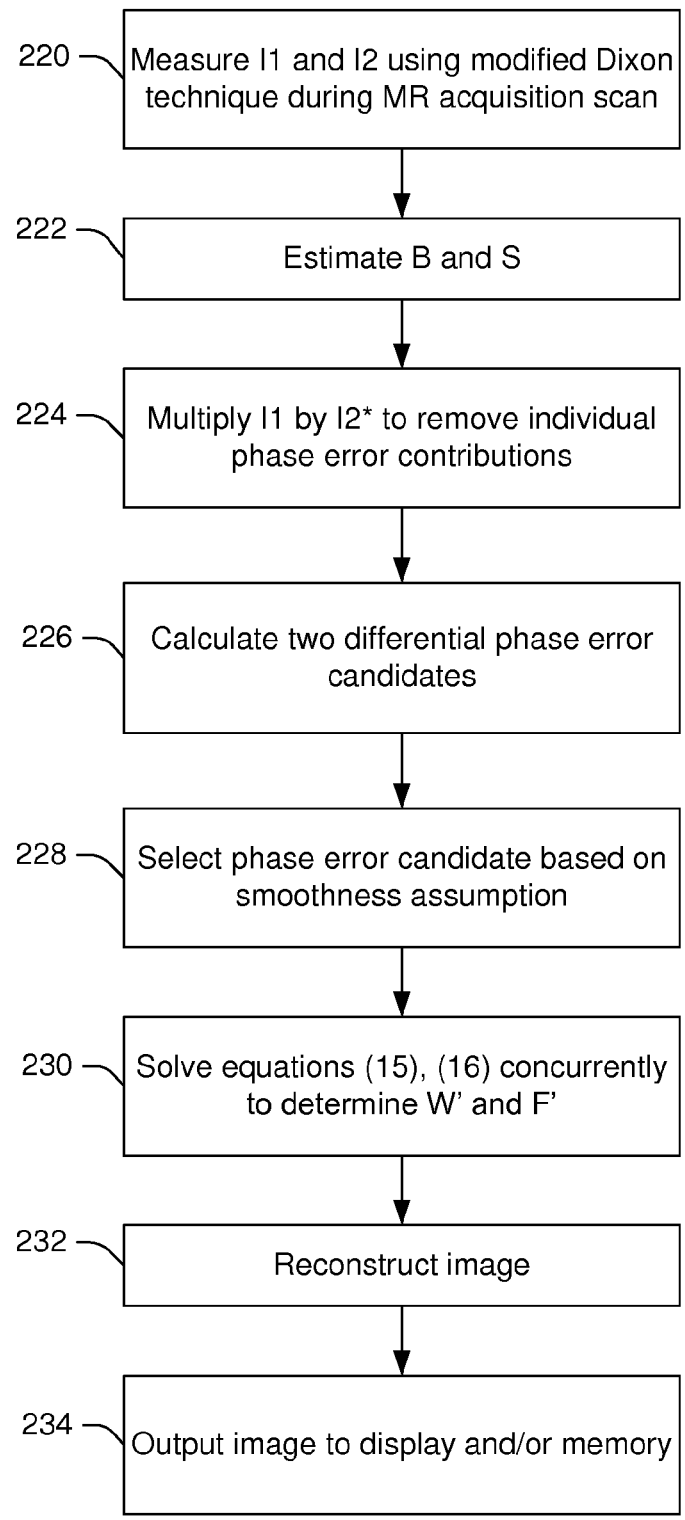
FIG. 9 illustrates a method for differentiating between fat and water molecules in a subject using arbitrary dual-echo data acquired during an MR scan, wherein an estimated differential phase error $\Delta\phi$ is employed to determine which of a big component B and a small component S of measured signals corresponds to water, and which corresponds to fat, and wherein the water and fat components are assumed to be complex values, in accordance with one or more aspects described herein.

FIG. 9 illustrates a method for differentiating between fat and water molecules in a subject using arbitrary dual-echo data acquired during an MR scan, wherein an estimated differential phase error $\Delta\phi$ is employed to determine which of a big component B and a small component S of measured signals corresponds to water, and which corresponds to fat, and wherein the water and fat components are assumed to be complex values, in accordance with one or more aspects described herein. At 220, a modified Dixon technique is used to measure two signals, $I_1$ and $I_2$, at two different echo times during an MR data acquisition. At 222 a "big" component B and a "small" component S of the respective signals are estimated (e.g., from equations (1) and (2)), with the only constraint that $\Theta_1 \neq \pm \Theta_2$. At 224, the signal $I_1$ is multiplied with the conjugate of $I_2$, the resulting equation depends on only W, F, $\Theta 1$, $\Theta 2$, and $\Delta\phi$, as set forth in Equation (9).

At 226, two differential phase error candidates are derived, as set forth by Equations (10) and (11). Among the two candidates, the actual differential phase error $\Delta\phi$ is selected as described above based on the smoothness assumption, at 228. At 230, two equations, which do not depend on $\phi_1$ and $\phi_2$, are derived as follows:

$$I_1 = W' + F'e^{i\theta_1} \qquad (15)$$

$$I_2 = (W' + F'e^{i\theta_2})e^{i\Delta\phi}. \qquad (16)$$

At 232, the two equations are concurrently solved to determine W' and F':

$$\begin{pmatrix} W' \\ F' \end{pmatrix} = \frac{1}{e^{i\theta_2} - e^{i\theta_1}} \begin{bmatrix} e^{i\theta_2} & -e^{i\theta_1} \\ -1 & 1 \end{bmatrix} \begin{pmatrix} I_1 \\ I_2 e^{-i\Delta\varphi} \end{pmatrix}, \qquad (17)$$

The MR scan data is then reconstructed into an image at 234. The image is output to a user (e.g., on the display 18 of FIG. 1) or stored to memory (e.g., the memory 16 of FIG. 1) at 236.

In one embodiment, the methods described herein further include weighting the signal $I_2$ before solving the three equations (15)-(17) to compensate for signal decay between the two echo times, using prior knowledge on expected relaxation time constants.

Having thus described the preferred embodiments, the invention is now claimed to be:

1. A method of differentiating between water and fat tissue in magnetic resonance image (MRI) data, comprising:
   measuring a first signal ($I_1$) and a second signal ($I_2$) at different arbitrary echo times during a magnetic resonance (MR) scan of a subject;
   calculating first and second components (B, S) from the first and second signals;
   deriving two differential phase error candidates ($\Delta\phi_1$, $\Delta\phi_2$) from the first and second components (B, S);
   selecting, for each pixel, one of the derived differential phase error candidates ($\Delta\phi$), based on an assumption of smoothness of disturbing field inhomogeneity;
   reconstructing a water image and a fat image using the selected differential phase error candidate ($\Delta\phi$).

2. The method according to claim 1, wherein the first component (B) is larger than or equal to the second component (S), and wherein the two differential phase error candidates are derived using the following equations:

$$e^{i\Delta\varphi_1} = \frac{I_1^* I_2}{(B + Se^{-i\Theta_1})(B + Se^{i\Theta_2})}$$

$$e^{i\Delta\varphi_2} = \frac{I_1^* I_2}{(S + Be^{-i\Theta_1})(S + Be^{i\Theta_2})}$$

wherein B is the first component, S is the second component, $\Theta_1$ is a water-fat angle of the first signal $I_1$, $\Theta_2$ is a water-fat angle of the second signal $I_2$, and $\Delta\phi_1$ and $\Delta\phi_2$ are the differential phase error candidates; and
further including applying the constraint that $\Theta_1 \neq \pm\Theta_2$.

3. The method according to claim 1, further including:
determining which of the first and second components represents a signal contribution from fat tissue, and which of the first and second components represents a signal contribution from water tissue.

4. The method according to claim 1, further including:
for each pixel, concurrently solving three equations to calculate the fat and water signal from the MRI data, the three equations being:

$I_1^* I_1 = (W + Fe^{i\Theta_1})(W + Fe^{-i\Theta_1})$ $I_2^* I_2 = (W + Fe^{i\Theta_2})(W + Fe^{-i\Theta_2})$ $I_1^* I_2 e^{-i\Delta\phi} = (W + Fe^{i\Theta_2})(W + Fe^{-i\Theta_1})$ wherein W represents a signal contribution from water and F represents a signal contribution from fat; and
further including weighting the signal $I_2$ before solving the three equations to compensate for signal decay between the two echo times, using prior knowledge on expected relaxation time constants.

5. The method according to claim 1, further including:
for each pixel, concurrently solving two equations to calculate the fat and water signal from the MRI data, the two equations being:

$I_1 = W' + F'e^{i\Theta_1}$ $I_2 = (W' + F'e^{i\Theta_2})e^{i\Delta\phi}$ and the solution being:

$$\begin{pmatrix} W' \\ F' \end{pmatrix} = \frac{1}{e^{i\Theta_2} - e^{i\Theta_1}} \begin{bmatrix} e^{i\Theta_2} & -e^{i\Theta_1} \\ -1 & 1 \end{bmatrix} \begin{pmatrix} I_1 \\ I_2 e^{-i\Delta\varphi} \end{pmatrix}$$

wherein W' represents a signal contribution from water and F' represents a signal contribution from fat; and
further including weighting the signal $I_2$ before solving the three equations to compensate for signal decay between the two echo times, using prior knowledge on expected relaxation time constants.

6. The method according to claim 1, further including:
reconstructing the MR data into an MR image; and
outputting the MR image to one of a display and a memory.

7. A computer-readable medium carrying software for controlling a processor to perform the method according claim 1.

8. A system that uses a modified Dixon technique to differentiate between water and fat tissue in magnetic resonance image (MRI) data, comprising:
a processor programmed to:
   measure a first signal ($I_1$) and a second signal ($I_2$) at different arbitrary echo times during a magnetic resonance (MR) scan of a subject,
   calculate first and second components (B, S) from the first and second signals,
   derive two differential phase error candidates ($\Delta\phi_1$, $\Delta\phi_2$) from the first and second components, and
   select, for each pixel, one differential phase error candidate ($\Delta\phi$), based on an assumption of smoothness of disturbing field inhomogeneity;
a reconstruction processor that reconstructs a water image and a fat image using the selected differential phase error candidate; and
a memory that stores the reconstructed images.

9. The system according to claim 8, wherein the first component is larger than or equal to the second component, and wherein the processor derives the two differential phase error candidates using the following equations:

$$e^{i\Delta\varphi_1} = \frac{I_1^* I_2}{(B + Se^{-i\Theta_1})(B + Se^{i\Theta_2})}$$

$$e^{i\Delta\varphi_2} = \frac{I_1^* I_2}{(S + Be^{-i\Theta_1})(S + Be^{i\Theta_2})}$$

wherein B is the first component, S is the second component, $\Theta_1$ is a water-fat angle of the first signal $I_1$, $\Theta_2$ is a water-fat angle of the second signal $I_2$, and $\Delta\phi_1$ and $\Delta\phi_2$ are the differential phase error candidates; and
wherein the processor applies the constraint that $\Theta_1 \neq \pm\Theta_2$.

10. The system according to claim 8, further including:
determining which of the first and second components (B, S) represents a signal contribution from fat tissue, and which of the first and second components represents a signal contribution from water tissue.

11. The system according to claim 8, wherein the processor concurrently solves three equations to calculate the fat and water signal, the three equations being:

$I_1^* I_1 = (W + Fe^{i\Theta_1})(W + Fe^{-i\Theta_1})$ $I_2^* I_2 = (W + Fe^{i\Theta_2})(W + Fe^{-i\Theta_2})$ $I_1^* I_2 e^{-i\Delta\phi} = (W + Fe^{i\Theta_2})(W + Fe^{-i\Theta_1})$ wherein W represents a signal contribution from water and F represents a signal contribution from fat; and wherein the processor weights the signal $I_2$ before solving the three equations to compensate for signal decay between the two echo times, using prior knowledge on expected relaxation time constants.

12. The system according to claim 8, wherein the processor concurrently solves two equations to calculate the fat and water signal, the two equations being:

$$I_1 = W' + F'e^{i\Theta_1}$$

$$I_2 = (W' + F'e^{i\Theta_2})e^{i\Delta\phi}$$

and the solution being:

$$\begin{pmatrix} W' \\ F' \end{pmatrix} = \frac{1}{e^{i\Theta_2} - e^{i\Theta_1}} \begin{bmatrix} e^{i\Theta_2} & -e^{i\Theta_1} \\ -1 & 1 \end{bmatrix} \begin{pmatrix} I_1 \\ I_2 e^{-i\Delta\varphi} \end{pmatrix}$$

wherein W' represents a signal contribution from water and F' represents a signal contribution from fat; and wherein the processor weights the signal $I_2$ before solving the three equations to compensate for signal decay between the two echo times, using prior knowledge on expected relaxation time constants.

13. The system according to claim 8, wherein the processor (14) applies a two-point Dixon technique to subsets of data from three-or-more-point Dixon acquisitions, to exploit redundancy, ensure consistency, and improve robustness and accuracy of a three-or-more-point Dixon technique.

14. The system according to claim 8, further including:
a display on which at least one of the water image and the fat image is displayed, or a combination of the two.

15. The system according to claim 14, further including:
first and second viewports on the display, on which the water image and the fat image are respectively displayed; and
a third viewport on the display, on which the water image and the fat image are adjustably overlaid on or combined with each other.

* * * * *